US 9,002,686 B2

(12) United States Patent
Devereux

(10) Patent No.: US 9,002,686 B2
(45) Date of Patent: Apr. 7, 2015

(54) SYSTEM AND METHOD FOR SIMULATING OPERATION OF SUBSTRUCTURES OF A CHEMICAL PROCESSING PLANT

(75) Inventor: Brian M. Devereux, Elk Grove Village, IL (US)

(73) Assignee: Honeywell International Inc., Morristown, NJ (US)

( * ) Notice: Subject to any disclaimer, the term of this patent is extended or adjusted under 35 U.S.C. 154(b) by 442 days.

(21) Appl. No.: 13/042,995

(22) Filed: Mar. 8, 2011

(65) Prior Publication Data
US 2012/0232875 A1 Sep. 13, 2012

(51) Int. Cl.
*G06G 7/48* (2006.01)
*G06F 17/50* (2006.01)

(52) U.S. Cl.
CPC ............ *G06F 17/5009* (2013.01); *G06F 17/50* (2013.01)

(58) Field of Classification Search
CPC ................................ G01N 1/286; G06T 19/00
USPC .............................................................. 703/6
See application file for complete search history.

(56) References Cited

U.S. PATENT DOCUMENTS

| | | | | |
|---|---|---|---|---|
| 5,224,053 A * | 6/1993 | Cook | ............................ | 700/206 |
| 5,754,808 A * | 5/1998 | Tanaka et al. | ................... | 715/763 |
| 5,818,736 A | 10/1998 | Leibold | | |
| 6,075,531 A * | 6/2000 | DeStefano | ..................... | 715/788 |
| 6,611,276 B1 * | 8/2003 | Muratori et al. | .............. | 715/772 |
| 6,718,533 B1 * | 4/2004 | Schneider et al. | ............ | 717/100 |
| 6,928,399 B1 * | 8/2005 | Watts et al. | ........................ | 703/2 |
| 7,412,367 B1 * | 8/2008 | Warlock et al. | ................... | 703/6 |
| 7,571,392 B2 * | 8/2009 | Cortesi | ......................... | 715/765 |
| 2002/0111783 A1 * | 8/2002 | Kodosky et al. | ................ | 703/13 |
| 2003/0071810 A1 * | 4/2003 | Shoov et al. | ................... | 345/420 |
| 2008/0109200 A1 | 5/2008 | Bartee et al. | | |
| 2008/0168016 A1 * | 7/2008 | Sekiai et al. | ..................... | 706/46 |
| 2009/0089030 A1 | 4/2009 | Sturrock et al. | | |
| 2010/0222899 A1 * | 9/2010 | Blevins et al. | .................. | 700/80 |
| 2011/0060567 A1 * | 3/2011 | Fujiwara | ............................ | 703/6 |
| 2012/0232875 A1 * | 9/2012 | Devereux | ........................ | 703/12 |

OTHER PUBLICATIONS

Hydromantis, "Delivering Value with Dynamic Simulation and Optimization", Mar. 15, 2006, http://www.technotrade.com.pk/upload/sheets/31psheet%5EProfessional_Brochure-edit.pdf.*
International Search Report dated Aug. 29, 2012 in connection with International Patent Application No. PCT/US2012/027689, 5 pages.

(Continued)

*Primary Examiner* — David Silver

(57) ABSTRACT

A method includes obtaining information defining a superstructure associated with a chemical processing facility. The superstructure includes simulated processing elements representing chemical processing elements within the chemical processing facility. The superstructure also includes flow streams representing flows of material between the chemical processing elements. The method also includes identifying a substructure within the superstructure, where the substructure is associated with active simulated processing elements and active flow streams within the superstructure. The method further includes generating a graphical display identifying the superstructure for presentation on a display. Active and inactive simulated processing elements have different indicia in the graphical display, and active and inactive flow streams have different indicia in the graphical display.

21 Claims, 4 Drawing Sheets

(56) References Cited

OTHER PUBLICATIONS

Written Opinion of International Searching Authority dated Aug. 29, 2012 in connection with International Patent Application No. PCT/US2012/027689, 4 pages.
"Creating a Reaction Engineering Process Model", www.engin.umich.edu, 2008, 9 pages.
"Conceptual design of chemical processes", Aspen Plus, www.spentech.com/core/aspen-plus.aspx, retrieved from the internet on Sep. 9, 2011, 3 pages.
"Conceptual design and performance improvement of processes", Aspen HYSYS, www.aspentech.com/products/aspen-hysys.aspx, retrieved from the internet on Sep. 9, 2011, 2 pages.
"Honeywell's Simulation Solution—UniSim", http://hpsweb.honeywell.com/Cultures/en-US/Products/ControlApplications/simulation/defa . . . , retrieved from the Internet on Sep. 9, 2011, 2 pages.
"Aspen HYSYS Upstream", www.aspentech.com/products/aspen-hysys-upstream.aspx, retrieved from the internet on Sep. 9, 2011, 2 pages.
"UniSim Design from Honeywell", http://hpsweb.honeywell.com/Cultures/en-US/Products/ControlApplications/simulation/Uni . . . , retrieved from the internet on Sep. 9, 2011, 2 pages.
"Introduction to Flowsheet Simulation, Introduction to Aspen Plus", AspenTechnology, Inc., 2003, retrieved from the Internet on Sep. 9, 2011, 4 pages.
"Aspen Tutorial#1: Aspen Basics", retrieved from the internet on Sep. 9, 2011, 9 pages.
"Aspen Tutorial#2: Convergence and Presentation of Results", retrieved from the internet on Sep. 9, 2011, 10 pages.
"Aspen Tutorial#3: Flash Separation", retrieved from the internet on Sep. 9, 2011, 11 pages.
"Aspen Tutorial#4: Thermodynamic Methods", retrieved from the Internet on Sep. 9, 2011, 7 pages.
"Aspen Tutorial#5: Sensitivity Analysis and Transport Properties", retrieved from the internet on Sep. 9, 2011, 13 pages.
"Aspen Tutorial#6: Aspen Distillation", retrieved from the Internet on Sep. 9, 2011, 17 pages.

\* cited by examiner

SYSTEM AND METHOD FOR SIMULATING OPERATION OF SUBSTRUCTURES OF A CHEMICAL PROCESSING PLANT

TECHNICAL FIELD

This disclosure is generally directed to simulation tools. More specifically, this disclosure relates to a system and method for simulating operation of substructures of a chemical processing plant.

BACKGROUND

Simulation tools have often been used to model the behavior of industrial processes. In many cases, these simulation tools can reduce the efforts needed to develop representative process models. Chemical process simulators are a particular type of simulation tool that model the behavior of chemical processes, such as those chemical processes in a chemical processing plant.

SUMMARY

This disclosure provides a system and method for simulating operation of substructures of a chemical processing plant.

In a first embodiment, a method includes obtaining information defining a superstructure associated with a chemical processing facility. The superstructure includes simulated processing elements representing chemical processing elements within the chemical processing facility. The superstructure also includes flow streams representing flows of material between the chemical processing elements. The method also includes identifying a substructure within the superstructure, where the substructure is associated with active simulated processing elements and active flow streams within the superstructure. The method further includes generating a graphical display identifying the superstructure for presentation on a display. Active and inactive simulated processing elements have different indicia in the graphical display, and active and inactive flow streams have different indicia in the graphical display.

In a second embodiment, an apparatus includes at least one memory unit configured to store information defining a superstructure associated with a chemical processing facility. The superstructure includes simulated processing elements representing chemical processing elements within the chemical processing facility. The superstructure also includes flow streams representing flows of material between the chemical processing elements. The apparatus also includes at least one processing unit configured to identify a substructure within the superstructure. The substructure is associated with active simulated processing elements and active flow streams within the superstructure. The at least one processing unit is also configured to generate a graphical display identifying the superstructure for presentation on a display. Active and inactive simulated processing elements have different indicia in the graphical display, and active and inactive flow streams have different indicia in the graphical display.

In a third embodiment, a computer readable medium embodies a computer program. The computer program includes computer readable program code for obtaining information defining a superstructure associated with a chemical processing facility. The superstructure includes simulated processing elements representing chemical processing elements within the chemical processing facility. The superstructure also includes flow streams representing flows of material between the chemical processing elements. The computer program also includes computer readable program code for identifying a substructure within the superstructure, where the substructure is associated with active simulated processing elements and active flow streams within the superstructure. The computer program further includes computer readable program code for generating a graphical display identifying the superstructure for presentation on a display. Active and inactive simulated processing elements have different indicia in the graphical display, and active and inactive flow streams have different indicia in the graphical display.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
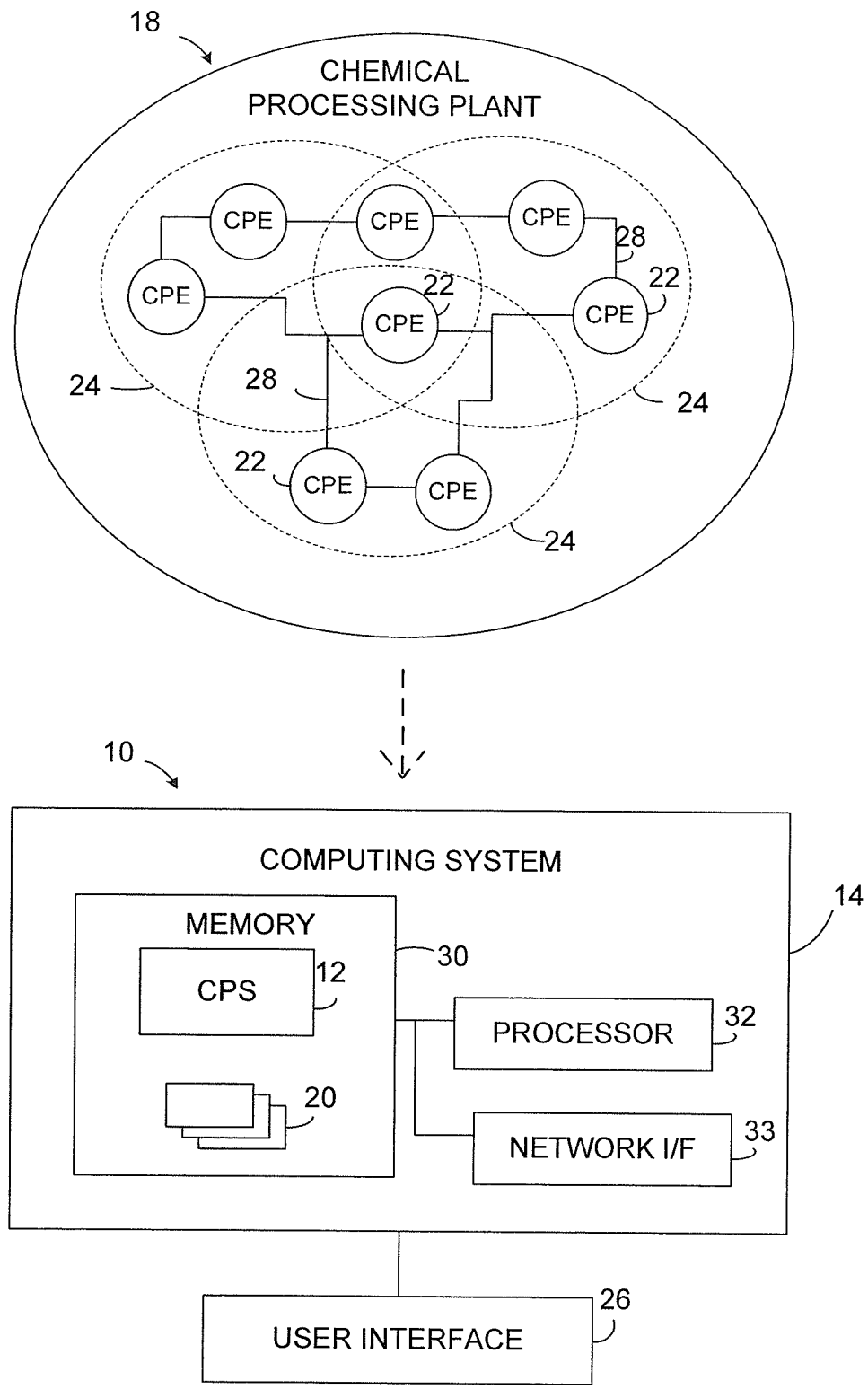
FIG. 1 illustrates an example process modeling system according to this disclosure.

FIG. 1 illustrates an example process modeling system 10 according to this disclosure. As shown in FIG. 1, the process modeling system 10 includes a chemical process simulator (CPS) 12, which simulates operation of a superstructure representing a chemical processing plant 18. For example, the chemical process simulator 12 can receive one or more files 20 containing information associated with the chemical processing plant 18. The chemical process simulator 12 can also identify, using one or more flow decision elements, active and inactive chemical processing elements (CPEs) 22 within the chemical processing plant 18. Using the identified active chemical processing elements 22, the chemical process simulator 12 can designate one or more substructures 24, each of which includes a portion of the chemical processing plant 18. Each of the substructures 24 may be displayed on a user interface 26 and simulated independently of inactive chemical processing elements 22 in the chemical processing plant 18. Movement of chemical ingredients or other products from one chemical processing element 22 to another is often facilitated by conduits 28, each of which represents any suitable path for transporting one or more chemical products.

The chemical processing plant 18 may be any type of industrial facility (or portion thereof) that produces a chemical product from one or more constituent chemical ingredients or that otherwise processes chemical products. Examples of chemical processing plants that may be simulated by the chemical process simulator 12 include oil or gas refineries, desalination plants, mineral refineries, wastewater treatment plants, power generation plants, and the like. The chemical processing plant 18 includes multiple chemical processing elements 22, each of which processes one or more chemical products in some specified manner. Examples of chemical processing elements 22 include heaters, holding tanks, valves, catalytic converters, mixers, separators, reactors, compressors, pumps, expanders, distillation units, surge tanks, accumulators, relief valves, absorbers, filters, and heat exchangers (including cross-flow exchangers, plate-fin exchangers, and shell-tube exchangers).

Each chemical processing element 22 performs some desired function involving one or more chemical ingredients or other products. For example, a particular chemical processing plant 18 may include a cracking device that breaks apart and separates a constituent chemical ingredient into its individual components. The cracking device may be connected to other elements, such as accumulators, heat exchangers, or dryers, that function together to produce a desired chemical product.

In many cases, a typical chemical processing plant 18 may be adapted to produce several different types of chemical products. For example, a particular chemical processing plant 18 may be adapted to produce several different types of ethylene-based products, such as ethylene glycol, polyethylene, polystyrene, and/or various derivatives thereof. The production of each product may be performed by a subset of the chemical processing elements 22 in the chemical processing plant 18. Also, operations associated with production of certain chemical products performed by the chemical processing elements 22 may be mutually exclusive to operations associated with production of other chemical products. For instance, certain chemical processing elements 22 may be used to produce only one chemical product at a time, while other chemical processing elements 22 could be used to produce different chemical products at a given time.

A subset of the chemical processing elements 22 that may be simultaneously operated to produce one particular chemical product is referred to as a substructure 24. In contrast, the overall structure of the chemical processing plant 18 may be referred to as a superstructure. In this example, there are three substructures 24 in a single superstructure, although the process modeling system 10 could be used with any number of superstructures, each having any number of substructures.

In many cases, it would be useful to simulate the operation of a substructure 24 without simulating the operation of an entire superstructure. Conventional chemical process simulators, however, do not model substructures 24 of a chemical processing plant 18 in an efficient manner. For example, conventional chemical process simulators may use an optimization process to determine the optimal process configuration with respect to some characteristic of the chemical process. As part of this optimization process, it may be desirous to replace or add certain chemical processing elements 22 with other chemical processing elements 22 in the chemical processing plant 18 to evaluate different process configurations. Because each chemical processing element 22 may have numerous intrinsic parameters that characterize their operation, these intrinsic parameters may need to be imported from other files not associated with the substructure 24 being optimized. The intrinsic parameters associated with each chemical processing element 22 may also be modified from time to time, thus requiring undue management of numerous simulation files to avoid use of obsolete intrinsic parameter information for simulation.

In accordance with this disclosure, the chemical process simulator 12 may provide reduced development time for modeling chemical processes by providing a central repository for all chemical processing elements 22 in a chemical processing plant 18. Thus, simulation or optimization of certain substructures 24 may be enhanced by providing for the replacement and/or addition of chemical processing elements 22 in a particular substructure 24 in an easily accessible manner. Also, the chemical process simulator 12 can provide reduce maintenance time by maintaining parameters associated with chemical processing elements 22 in a single file 20, meaning changes or modifications to the parameters of one chemical processing element 22 can be automatically propagated to all substructures 24 that use the chemical processing element 22. Further, the chemical process simulator 12 may provide mixed-integer nonlinear programming (MINLP) techniques to identify the optimal substructures 24 of the chemical processing plant 18 in an efficient manner. These represent various features or advantages that could be implemented or realized, depending on the embodiment. Additional details regarding the chemical process simulator 12 are provided below.

The chemical process simulator 12 includes any suitable structure for simulating at least one subsystem 24 of chemical processing elements 22 within a larger supersystem. For example, the chemical process simulator could be implemented using hardware only or a combination of hardware and software/firmware instructions. In this example, the chemical process simulator 12 is implemented using a computing system 14 that includes at least one memory unit 30, at least one processing unit 32, and at least one network interface 33. The at least one memory unit 30 includes any suitable volatile and/or non-volatile storage and retrieval device(s), such as a hard disk, an optical storage disc, RAM, or ROM. The at least one processing unit 32 includes any suitable processing structure(s), such as a microprocessor, microcontroller, digital signal processor, application specific integrated circuit, or field programmable gate array. The at least one network interface 33 includes any suitable structure(s) for communicating over one or more networks, such as a wired Ethernet interface or a wireless interface. This represents one specific way in which the chemical process simulator 12 can be implemented, and other implementations of the chemical process simulator 12 could be used.

When implemented using software and/or firmware, the chemical process simulator 12 may include any suitable program instructions that simulate one or more chemical processes. In some embodiments, the chemical process simulator 12 may be implemented using the UNISIM DESIGN SUITE from HONEYWELL INTERNATIONAL INC.

The user interface 26 includes any suitable structure for providing information to a user and optionally receiving information from a user. For example, the user interface 26 could represent a desktop computer, laptop computer, dummy computer terminal, or other computing device. Often times, the user interface 26 is located in a control room for the chemical processing plant 18, although the user interface 26 could be positioned at any suitable location.

Although FIG. 1 illustrates one example of a process modeling system 10, various changes may be made to FIG. 1. For example, the system 10 could include any number of computing systems 14, user interfaces 26, and chemical processing plants 18. Also, the functional division shown in FIG. 1 is for illustration only. Various components in FIG. 1 could be combined, further subdivided, or omitted and additional components could be added according to particular needs. For instance, the computing system 14 could be integrated into the user interface 26. In addition, the chemical processing plant 18 could have any suitable structure with any number and arrangement of chemical processing elements 22 and conduits 28.

Figure 2:
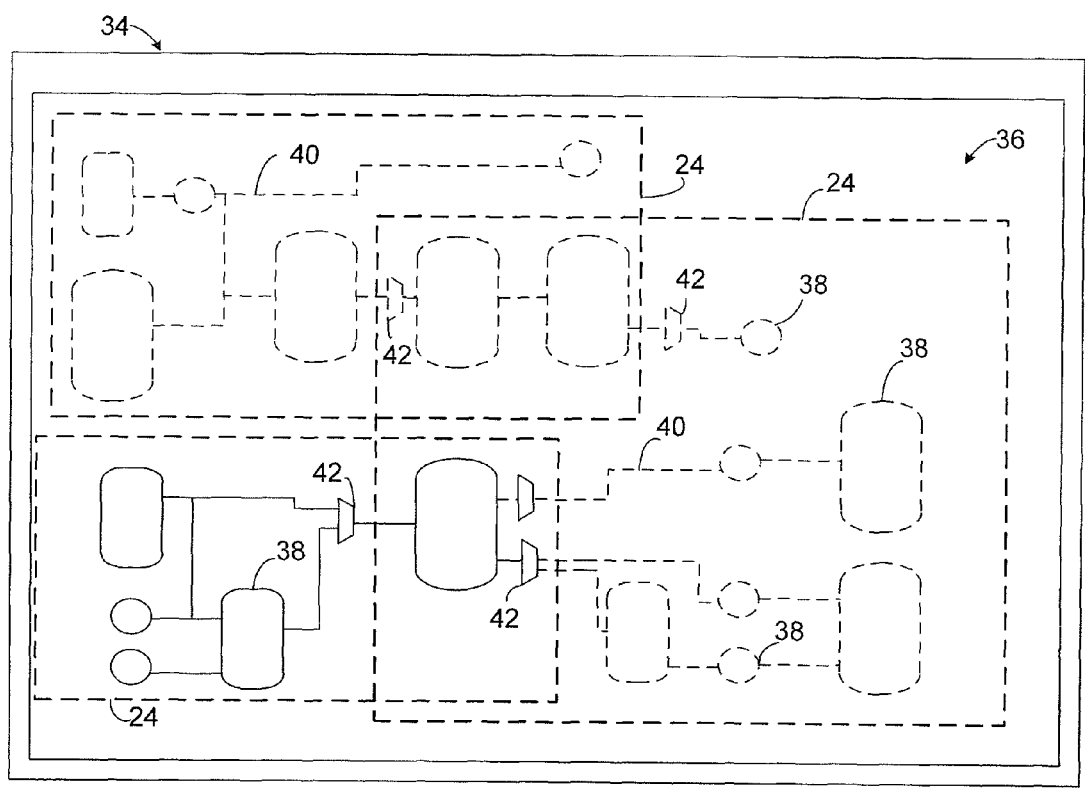
FIG. 2 illustrates an example superstructure window that may be displayed on a user interface in the process modeling system of FIG. 1 according to this disclosure.

FIG. 2 illustrates an example superstructure window 34 that may be displayed on a user interface 26 in the process modeling system 10 of FIG. 1 according to this disclosure. In this example, the superstructure window 34 displays a process flow diagram (PFD) (flowsheet) view of a superstructure 36, which represents a chemical processing plant 18. The process flow diagram includes multiple simulated processing elements 38 that are connected by various flow streams 40. The simulated processing elements 38 represent chemical processing elements 22 of the chemical processing plant 18. The flow streams 40 represent mass flows of chemical materials that may be transferred between chemical processing element 22 through the conduits 28.

In accordance with this disclosure, the process flow diagram in FIG. 2 may also include one or more flow decision elements 42. In general, each flow decision element 42 will be connected to one or more inlet flow streams 40 and one or more outlet flows streams 40. Each flow decision element 42 is configured to selectively set its connected flow streams 40 to either an active state (indicating that the stream has a non-zero mass flow rate) or to an inactive state (indicating that no mass flow rate exists). In certain embodiments, each processing element 38 will also have an active/inactive state parameter. The active/inactive state can represented as a simple boolean (true/false) or integer value. For example, an integer value of "1" may be used to indicate the active state, and an integer value of "0" may be used to indicate the inactive state. A processing element 38 will be taken as inactive when all the inlet flow streams are inactive, but may be active otherwise.

Based upon the specification of the flow decision elements 42 and any specified active/inactive states of flow streams 40 and processing elements 38, the chemical process simulator 12 may determine the active/inactive states of the remaining flow streams 40 and processing elements 38. The flow streams 40 and processing elements 38 with an active state will constitute the substructure 24 within the superstructure 36. The active inactive state parameter associated with each flow stream 40 and simulated processing element 38 allows the chemical process simulator 12 to ignore processing elements 38 and flow streams 40 having inactive states during simulation and process only those having active states. The simulation of the determined substructure 24 may be thus performed in an efficient manner.

The flow decision elements 42 may represent any component or methodology of the chemical processing plant 18 that alternatively activates and/or deactivates flow streams 40 and associated simulated processing elements 38 to define a substructure. In some embodiments, a flow decision element 42 may represent one or more valves that switch flow from one flow stream to another or that halt movement of mass through a flow stream 40. In other embodiments, flow decision elements 42 may logically represent alternative flow streams 40 that may be configured manually. For example, a particular flow decision element 42 may represent a "hard-wired" piping structure that may be manually re-routed to another flow stream by cutting the piping structure and adjoining (hard-wiring) one end to a differing piping structure. In still other embodiments, the flow decision elements 42 may be used to alternatively select a group of simulated processing elements 38. For instance, a particular chemical processing plant 18 may include a xylene section including several simulated processing elements 38 that function together to generate the chemical formulation "xylene." A flow decision element 42 may be created at the inlet and/or output portion of the xylene section to alternatively make all of the simulated processing elements 38 in the xylene section active or inactive.

As noted above, the chemical process simulator 12 simulates operation of the chemical processing plant 18 based upon information included in the superstructure file(s) 20. The superstructure file 20 may include intrinsic parameters associated with each simulated processing element 38. Intrinsic parameters generally refer to static characteristics that do not change or that change relatively little in response to changes in operation of the chemical processing plant 18. One example of an intrinsic parameter may include a maximum British-Thermal-Unit (BTU) output of a particular simulated processing element 38 that represents a heater. The superstructure 36 may also include operational parameters associated with a particular process. As opposed to intrinsic parameters, operational parameters may be adjusted to achieve a desired output of a particular simulated processing element 38 or of the chemical processing plant 18 as a whole. An operational parameter may be stored in the superstructure file 20 that includes information associated with actual BTUs generated by the heater to achieve a desired chemical function upon stream flows through the heater. When implemented using the UNISIM DESIGN SUITE, the chemical process simulator 12 can store spreadsheet files 20 in which individual cells of the spreadsheet may be populated with intrinsic and operational parameters associated with simulated processing elements 38 of the superstructure 36.

In certain embodiments, different substructure configurations of the superstructures 36 may be stored and/or archived in any suitable manner. The superstructure file(s) 20 may be used to store and/or archive the specifications for various substructures 24 along with the full superstructure 36. In one embodiment, the specifications of the flow decision elements 42 may be stored as a set to define a substructure. In other embodiments, different specifications of the substructures 24 and the superstructure 36 may be stored and/or archived in any suitable manner. A particular substructure 24 may be selected by setting the appropriate specifications of the flow decision elements 42 as recalled from storage. Other substructures 24 may be defined by copying and modifying the specification of a different existing substructure 24. The ability to easily define a group of alternate substructures may enable the process chemical process simulator 12 to efficiently evaluate and compare the process operation of various substructures by consecutively simulating the substructures.

During operation, the chemical process simulator 12 may display the superstructure 36 in the superstructure window 34 and use different indicia for active and inactive elements. Any type of differing indicia may be used. In FIG. 2, different line patterns are used. More specifically, solid lines are used to denote active elements, while dashed lines are used to denote inactive elements. However, any other suitable approach could be used. For instance, active and inactive elements may be displayed with different brightness levels. As another example, active elements may be displayed with lines having enhanced boldness relative to their inactive counterparts. As yet another example, the chemical process simulator 12 could display active flow streams 40 with a color that is different from the color associated with inactive flow streams 40. For example, active flow streams 40 could be yellow, while inactive flow streams 40 could be gray. In this manner, users of the chemical process simulator 12 may easily identify active flow streams 40 and their respective simulated processing elements 38.

In certain embodiments, the chemical process simulator 12 may be configured to determine active and inactive flow streams 40 and processing elements 38 from flow decision elements 42 and display the active and inactive flow streams 40 with differing indicia in the superstructure window 34 without previously performing a simulation. That is, the chemical process simulator 12 may be configured to use information associated with flow decision elements 42 to identify and display active and inactive flow streams 40 in real-time in an interactive manner. For example, a user of the chemical process simulator 12 may modify a particular flow decision element 42 to switch one output flow stream 40 to another output flow stream 40. Upon entry of this information, the chemical process simulator 12 may process the flow streams 40 associated with the particular flow decision element 42 and modify the indicia of each flow stream 40 according to its active/inactive state.

Although FIG. 2 illustrates one example of a superstructure window 34 that may be displayed on a user interface 26 in the process modeling system 10 of FIG. 1, various changes may be made to FIG. 2. For example, as noted above, any suitable indicia can be used to denote different status information in the superstructure window 34. Also, the content of the superstructure window 34 in FIG. 2 is for illustration only and would vary depending on the chemical processing plant 18.

Figure 3:
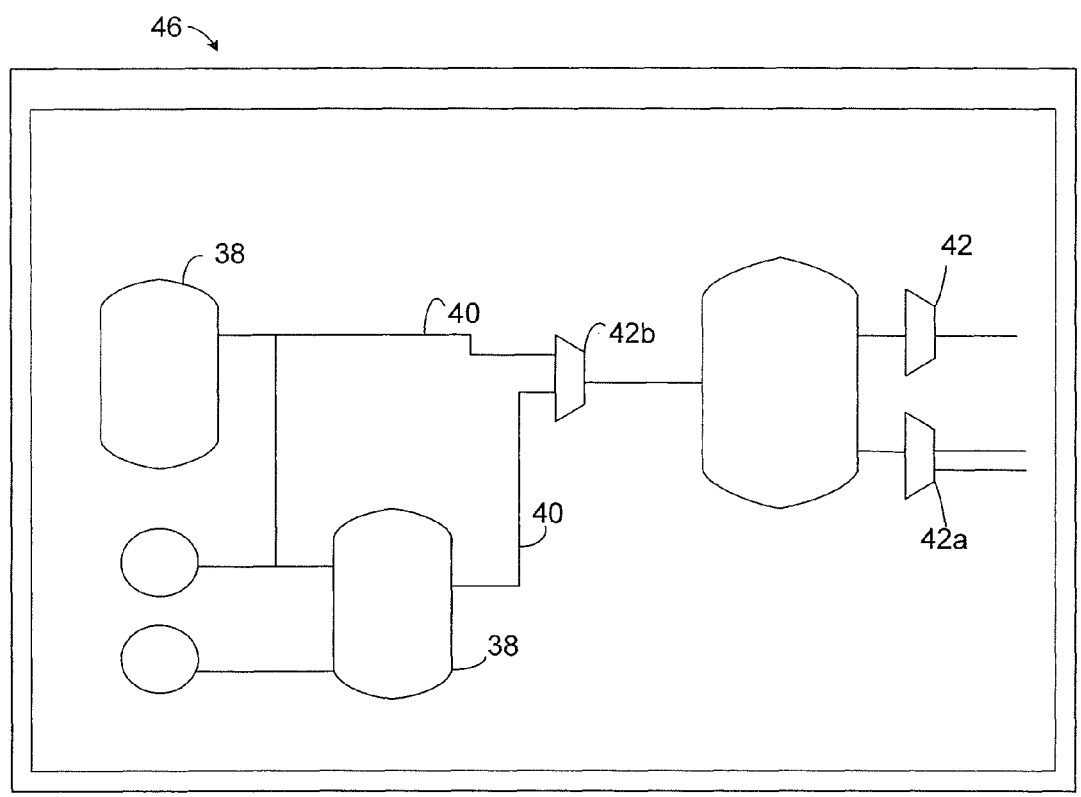
FIG. 3 illustrates an example substructure window that may be displayed on a user interface in the process modeling system of FIG. 1 according to this disclosure.

FIG. 3 illustrates an example substructure window 46 that may be displayed on a user interface 26 in the process modeling system 10 of FIG. 1 according to this disclosure. As shown in FIG. 3, the substructure window 46 includes only those simulated processing elements 38 and their associated flow streams 40 that are in an active state. The chemical process simulator 12 may be configured to generate the substructure window 46 after flow decision elements 42 have been set to identify active and inactive flow streams 40 in the superstructure 36.

The chemical process simulator 12 may also be configured to generate the substructure window 46 from a previously-generated superstructure window 34 with only active processing elements. In many cases, a superstructure 36 may include numerous simulated processing elements 38 such that the superstructure window 34 becomes cluttered. Also, the display of a substructure 24 within a superstructure 36 may, in some cases, complicate analysis of any derived simulated results. Thus, the chemical process simulator 12 may be configured to generate a substructure window 46, separate from its parent superstructure window 34, to display only those simulated processing elements 38 affected in a current simulation.

In FIG. 3, the flow decision elements 42 may be designated as routers 42a or selectors 42b. Routers 42a generally refer to flow decision elements 42 having one input and multiple outputs. Selectors 42b generally refer to flow decision elements 42 having multiple inputs and one output. Routers 42a may be used to select one of multiple outputs to receive a flow stream 40. Conversely, selectors 42b may be used to select one of multiple inputs to provide a flow stream 40 to an output. Flow streams 40 of unselected outputs for routers 42 or unselected inputs for selectors 42b may be designated as inactive, while selected flows 40 may be designated as active. Thus, the chemical process simulator 12 may use routers 42a to alternatively make inputs to certain simulated processing elements 38 active and use selectors 42b to alternatively make outputs to certain simulated processing elements 38 active.

Although FIG. 3 illustrates one example of a substructure window 46 that may be displayed on a user interface 26 in the process modeling system 10 of FIG. 1, various changes may be made to FIG. 3. For example, as noted above, any suitable indicia can be used to denote different status information in the substructure window 46. Also, the content of the substructure window 46 in FIG. 3 is for illustration only and would vary depending on the chemical processing plant 18.

Figure 4:
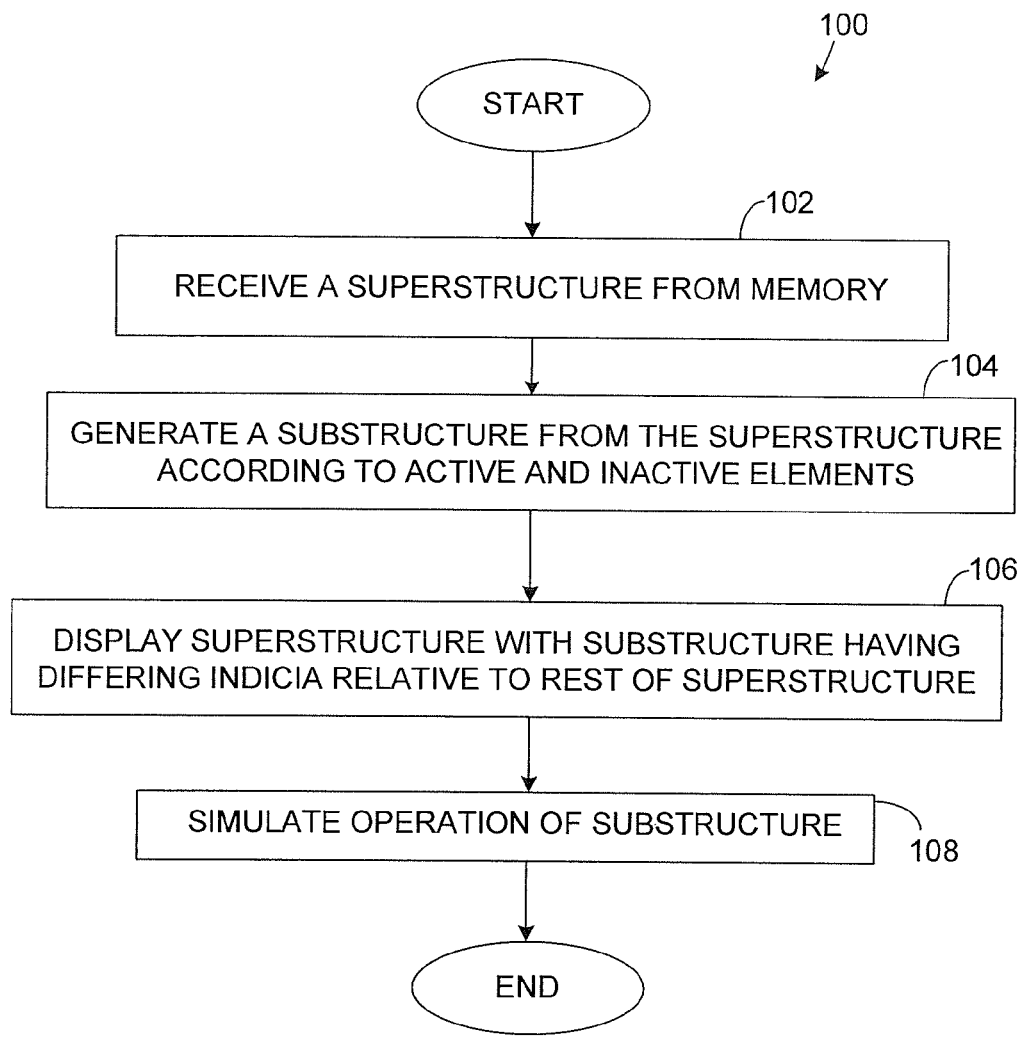
FIG. 4 illustrates an example method for simulating operation of substructures of a chemical processing plant according to this disclosure.

FIG. 4 illustrates an example method 100 for simulating operation of substructures of a chemical processing plant according to this disclosure. As shown in FIG. 4, a chemical process simulator receives information associated with a superstructure from a memory at step 102. This could include, for example, the chemical process simulator 12 retrieving data from a superstructure file 20 defining flow decision elements 42 that are located between flow streams 40 of a superstructure 36.

The chemical process simulator generates a substructure from the superstructure based on active/inactive flags associated with the superstructure's components at step 104. This could include, for example, the chemical process simulator 12 determining whether flow streams 40 and their associated simulated processing elements 38 are active or inactive according to the flow decision elements 42. This may or may not include simulating the operation of a chemical processing plant 18 represented by the superstructure.

The chemical process simulator displays the superstructure on a user interface at step 106. This could include, for example, the chemical process simulator 12 generating a graphical user display containing a superstructure window 34. In the superstructure window 34, flow streams 40 and simulated processing elements 38 having an active state can be displayed with different indicia than the flow streams 40 and simulated processing elements 38 in the inactive state. The substructure window 46 in which the substructure is displayed may be separate or distinct from the superstructure window 34.

The chemical process simulator may simulate operation of the substructure at step 108. This could include, for example, the chemical process simulator 12 simulating the behavior of the chemical processing elements 22 in the chemical processing plant 18 based on the flow streams 40 and simulated processing elements 38 within the substructure. During the simulation, flow streams 40 and simulated processing elements 38 outside of the active substructure 24 can be ignored.

Although FIG. 4 illustrates one example of a method 100 for simulating operation of substructures of a chemical processing plant, various changes may be made to FIG. 4. For example, steps 102-108 may be performed any number of times. As a particular example, optimization simulations may be performed by simulating operation using one specific simulated processing element 38 and subsequently performing another simulation using a different simulated processing element 38. This can be done by modifying the appropriate operational parameter(s) of the flow decision element(s) 42. Typically, the operational parameters of the flow decision elements will have integer values to set the active/inactive states. Additionally, mixed-integer nonlinear programming (MINLP) techniques can be used to solve the optimization problem.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   using at least one processing device:
   obtaining information defining a superstructure associated with a chemical processing facility, the superstructure comprising simulated processing elements representing chemical processing elements within the chemical processing facility, the superstructure also comprising flow streams representing flows of material between the chemical processing elements;
   storing in a repository parameters of the chemical processing elements in the chemical processing facility, the repository configured to receive modifications to the parameters of the chemical processing elements;
   in response to receiving modifications to the parameters of at least one of the chemical processing elements, propagating the modifications to substructures within the superstructure that use the at least one chemical processing element;
   identifying a specified one of the substructures within the superstructure, the specified substructure including simulated processing elements and flow streams having active states within the superstructure, wherein the identification is based on the active states of the active simulated processing elements and the active flow streams; and
   generating a graphical display identifying the superstructure for presentation on a display, wherein active and inactive simulated processing elements have different indicia in the graphical display, and wherein active and inactive flow streams have different indicia in the graphical display;
   wherein the superstructure further comprises one or more flow decision elements, each flow decision element representing one of (i) a selection of one input flow stream from multiple input flow streams for output as an output flow stream and (ii) a selection of one output flow stream from multiple output flow streams to receive an input flow stream.

2. The method of claim 1, further comprising:
   generating a second graphical display identifying the specified substructure for presentation on the display.

3. The method of claim 2, further comprising:
   presenting the second graphical display in a different window than a window in which the first graphical display is presented.

4. The method of claim 1, further comprising:
   simulating operation of the active simulated processing elements in the specified substructure using the active flow streams;
   wherein the inactive simulated processing elements and the inactive flow streams are ignored in the simulation.

5. The method of claim 1, wherein each flow decision element is configured to define at least one of: one or more inactive input flow streams and one or more inactive output flow streams.

6. The method of claim 1, wherein:
   the different indicia for the active and inactive simulated processing elements comprise different line patterns; and
   the different indicia for the active and inactive flow streams comprise different colors.

7. An apparatus comprising:
   at least one memory device configured to store information defining a superstructure associated with a chemical processing facility, the superstructure comprising simulated processing elements representing chemical processing elements within the chemical processing facility, the superstructure also comprising flow streams representing flows of material between the chemical processing elements; and
   at least one processing device configured to:
   store in a repository parameters of the chemical processing elements in the chemical processing facility, the repository configured to receive modifications to the parameters of the chemical processing elements;
   in response to receiving modifications to the parameters of at least one of the chemical processing elements, propagate the modifications to substructures within the superstructure that use the at least one chemical processing element;
   identify a specified one of the substructures within the superstructure, the specified substructure including simulated processing elements and flow streams having active states within the superstructure, wherein the identification is based on the active states of the active simulated processing elements and the active flow streams; and
   generate a graphical display identifying the superstructure for presentation on a display, wherein active and inactive simulated processing elements have different indicia in the graphical display, and wherein active and inactive flow streams have different indicia in the graphical display;
   wherein the superstructure further comprises one or more flow decision elements, each flow decision element representing one of (i) a selection of one input flow stream from multiple input flow streams for output as an ou ut flow stream and ii a selection of one output flow stream from multiple output flow streams to receive an input flow stream.

8. The apparatus of claim 7, wherein the at least one processing device is further configured to generate a second graphical display identifying the specified substructure for presentation on the display.

9. The apparatus of claim 8, wherein the at least one processing device is further configured to output the second graphical display for presentation in a different window than a window in which the first graphical display is presented.

10. The apparatus of claim 7, wherein:
    the at least one processing device is further configured to simulate operation of the active simulated processing elements in the specified substructure using the active flow streams; and the at least one processing device is configured to ignore the inactive simulated processing elements and the inactive flow streams in the simulation.

11. The apparatus of claim 7, wherein the at least one processing device is further configured to use each flow decision element to define at least one of: one or more inactive input flow streams and one or more inactive output flow streams.

12. The apparatus of claim 7, wherein:
the different indicia for the active and inactive simulated processing elements comprise different line patterns; and
the different indicia for the active and inactive flow streams comprise different colors.

13. A non-transitory computer readable medium embodying a computer program, the computer program comprising computer readable program code that, when executed, causes at least one processing device to perform the steps of:
obtaining information defining a superstructure associated with a chemical processing facility, the superstructure comprising simulated processing elements representing chemical processing elements within the chemical processing facility, the superstructure also comprising flow streams representing flows of material between the chemical processing elements;
storing in a repository parameters of the chemical processing elements in the chemical processing facility, the repository configured to receive modifications to the parameters of the chemical processing elements;
in response to receiving modifications to the parameters of at least one of the chemical processing elements, propagating the modifications to substructures within the superstructure that use the at least one chemical processing element;
identifying a specified one of the substructures within the superstructure, the specified substructure including simulated processing elements and flow streams having active states within the superstructure, wherein the identifying is based on the active states of the active simulated processing elements and the active flow streams; and
generating a graphical display identifying the superstructure for presentation on a display, wherein active and inactive simulated processing elements have different indicia in the graphical display, and wherein active and inactive flow streams have different indicia in the graphical display;
wherein the superstructure further comprises one or more flow decision elements, each flow decision element representing one of (i) a selection of one input flow stream from multiple input flow streams for output as an output flow stream and (ii) a selection of one output flow stream from multiple output flow streams to receive an input flow stream.

14. The non-transitory computer readable medium of claim 13, wherein the computer program further comprises computer readable program code that, when executed, causes the at least one processing device to perform the step of:
generating a second graphical display identifying the specified substructure for presentation on the display.

15. The non-transitory computer readable medium of claim 14, wherein the computer program further comprises computer readable program code that, when executed, causes the at least one processing device to perform the step of:
outputting the second graphical display for presentation in a different window than a window in which the first graphical display is presented.

16. The non-transitory computer readable medium of claim 13, wherein:
the computer program further comprises computer readable program code that, when executed, causes the at least one processing device to perform the step of simulating operation of the active simulated processing elements in the specified substructure using the active flow streams; and
the computer readable program code that causes the at least one processing device to simulate the operation of the active simulated processing elements is configured to ignore the inactive simulated processing elements and the inactive flow streams in the simulation.

17. The non-transitory computer readable medium of claim 13, wherein each flow decision element is configured to define at least one of: one or more inactive input flow streams and one or more inactive output flow streams.

18. The method of claim 1, further comprising:
receiving user input to modify a particular one of the one or more flow decision elements; and
without previously performing a simulation, determining the active and inactive flow streams and the active and inactive simulated processing elements based on the particular flow decision element modified by the user.

19. The method of claim 1, wherein:
storing the parameters comprises maintaining the parameters in a single file in the repository; and
propagating the modifications comprises propagating the modifications to all substructures within the superstructure that use the at least one chemical processing element.

20. The apparatus of claim 7, wherein the at least one processing device is further configured to:
receive user input to modify a particular one of the one or more flow decision elements; and
without previously performing a simulation, determine the active and inactive flow streams and the active and inactive simulated processing elements based on the particular flow decision element modified by the user.

21. The non-transitory computer readable medium of claim 13, wherein the computer program further comprises computer readable program code that, when executed, causes the at least one processing device to perform the steps of:
receiving user input to modify a particular one of the one or more flow decision elements; and
without previously performing a simulation, determining the active and inactive flow streams and the active and inactive simulated processing elements based on the particular flow decision element modified by the user.

* * * * *